(12) United States Patent
Chen et al.

(10) Patent No.: US 10,281,488 B2
(45) Date of Patent: May 7, 2019

(54) PROBE CARD HAVING REPLACEABLE PROBE MODULE AND ASSEMBLING METHOD AND PROBE MODULE REPLACING METHOD OF THE SAME

(71) Applicant: MPI CORPORATION, Chu-Pei, Hsinchu Shien (TW)

(72) Inventors: Shih-Shin Chen, Chu-Pei (TW); Cheng-En Wu, Chu-Pei (TW); Chia-Hsiang Yu, Chu-Pei (TW)

(73) Assignee: MPI CORPORATION, Chu-Pei, Hsinchu Shien (TW)

( * ) Notice: Subject to any disclaimer, the term of this patent is extended or adjusted under 35 U.S.C. 154(b) by 92 days.

(21) Appl. No.: 15/488,181

(22) Filed: Apr. 14, 2017

(65) Prior Publication Data

US 2017/0315149 A1 Nov. 2, 2017

(30) Foreign Application Priority Data

Apr. 27, 2016 (TW) .............................. 105113147 A

(51) Int. Cl.
*G01R 22/00* (2006.01)
*G01R 1/04* (2006.01)
(Continued)

(52) U.S. Cl.
CPC ....... *G01R 1/0408* (2013.01); *G01R 1/06705* (2013.01); *G01R 1/07307* (2013.01);
(Continued)

(58) Field of Classification Search
CPC ....... G01R 1/00; H01L 21/00; H01L 2221/00; G01D 1/00
See application file for complete search history.

(56) References Cited

U.S. PATENT DOCUMENTS 7,579,857 B2 * 8/2009 Chen .................. G01R 1/06727
216/11
2007/0007977 A1 * 1/2007 Eldridge ............ G01R 31/2889
324/756.03
(Continued)

FOREIGN PATENT DOCUMENTS

CN 1657949 A 8/2005
TW M421505 A 1/2012

*Primary Examiner* — Jeff W Natalini
*Assistant Examiner* — Temilade S Rhodes-Vivour
(74) *Attorney, Agent, or Firm* — Muncy, Geissler, Olds & Lowe, P.C.

(57) ABSTRACT

A probe card includes a substrate module having an installation hole and a first stair-shaped structure provided on two stairs thereof with a first connection surface and a first transmission surface having a first contact pad, a probe module having a probe and a second stair-shaped structure provided on two stairs thereof with a second connection surface and a second transmission surface having a second contact pad electrically connected with the probe, and a pressing member. The probe module is disposed in the installation hole so that the first and second connection surfaces are connected and the first and second transmission surfaces are opposite. The pressing member is detachably pressed on the probe module to press the second connection surface against the first connection surface and make the first and second contact pads electrically connected.

12 Claims, 8 Drawing Sheets

(51) Int. Cl.
*G01R 1/067* (2006.01)
*G01R 1/073* (2006.01)
H01L 21/00 (2006.01)
G01R 1/00 (2006.01)

(52) U.S. Cl.
CPC .............. *G01R 1/00* (2013.01); *G01R 22/00* (2013.01); *H01L 21/00* (2013.01); *H01L 2221/00* (2013.01)

(56) References Cited

U.S. PATENT DOCUMENTS

| | | | | |
|---|---|---|---|---|
| 2009/0058440 A1* | 3/2009 | Miura | ................ | G01R 1/07314 324/750.16 |
| 2009/0212798 A1* | 8/2009 | Kasukabe | .......... | G01R 1/06727 324/754.07 |
| 2010/0308855 A1* | 12/2010 | Pagani | .................. | B62M 25/04 324/756.03 |
| 2014/0352460 A1* | 12/2014 | Kuo | .................. | G01R 1/07357 73/866.5 |

* cited by examiner

PROBE CARD HAVING REPLACEABLE PROBE MODULE AND ASSEMBLING METHOD AND PROBE MODULE REPLACING METHOD OF THE SAME

BACKGROUND OF THE INVENTION

1. Field of the Invention

The present invention relates generally to probe cards and more particularly, to a probe card having a replaceable probe module, and an assembling method and a probe module replacing method of the probe card.

2. Description of the Related Art

US Patent Pub. No. 2007/0007977 discloses a probe card which primarily includes a wiring substrate, a stiffener plate fixed on the wiring substrate, an adjustment plate disposed on the stiffener plate, and a probe head module fixed at the bottom of the adjustment plate and passing through a central hole of the wiring substrate and a central hole of the stiffener plate. The probe head module primarily includes a probe head provided with a plurality of probes, and a probe head fastening seat carrying the probe head and fastened by screws. The probes are located under the wiring substrate for probing a device under test (hereinafter referred to as the "DUT"), and electrically connected with connectors on the wiring substrate through a plurality of conductive pins and wires so as to be electrically connected with a tester through the connectors.

The aforesaid probe head module is fastened to the adjustment plate by a plurality of bolts and nuts. The adjustment plate is fastened to the stiffener plate by a plurality of fastening screws. In addition, a plurality of adjustment screws are inserted through the adjustment plate and abutted against the stiffener plate. When the fastening screws don't make the adjustment plate completely abutted on the stiffener plate but reserve a gap between the adjustment plate and the stiffener plate, each adjustment screw is rotatable by the user to make the associated part of the adjustment plate approach or leave the stiffener plate, thereby adjusting the orientation of the adjustment plate relative to the wiring substrate for correcting the orientation of each of the probes relative to the DUT, such that the imaginary plane defined by the pinpoints of the probes may have an acceptable flatness relative to the DUT. However, this adjustment method is time-consuming.

Further, the aforesaid probe card is complicated in structure, resulting in that it is time-consuming in assembling of the aforesaid probe card, and the aforesaid flatness correcting process of the probe card is also time-consuming. Besides, when the probe head needs to be replaced because the probe is damaged, the user has to dismount the combination of the probe head fastening seat and the probe head by removing the screws that are fastened to the probe head fastening seat downwardly, for doing the replacement work. Such process is not easily performed, and may need an auxiliary jig, if necessary. Alternately, the user can dismount the whole probe head module, then dismount the probe head fastening seat, and then replace the probe head. Such process is more complicated and time-consuming, and difficult in alignment.

SUMMARY OF THE INVENTION

The present invention has been accomplished in view of the above-noted circumstances. It is an objective of the present invention to provide a probe card having a replaceable probe module, which is simple and compact in structure and accurate in alignment, thereby saving assembling time, and preventing time-consuming process of correcting the orientation of the probe. Besides, the probe module of the probe card can be so quickly replaced as to enhance the test efficiency and save the cost.

To attain the above objective, the present invention provides a probe card which includes a substrate module, a probe module, and a pressing member. The substrate module has an installation hole and a first stair-shaped structure which is located on an inner wall of the installation hole and provided with a first substrate stair having a first connection surface and a second substrate stair having a first transmission surface provided with a first contact pad. The probe module has a probe and a second stair-shaped structure which is provided with a first probe stair having a second connection surface and a second probe stair having a second transmission surface provided with a second contact pad electrically connected with the probe. The probe module is disposed in the installation hole of the substrate module in a way that the first connection surface is connected with the second connection surface and the first transmission surface faces the second transmission surface. The pressing member has a pressing portion which is detachably pressed on the probe module in a way that the second connection surface is abutted against the first connection surface and the first contact pad is electrically connected with the second contact pad.

As a result, as long as the first and second connection surfaces are processed by precise plane machining in the manufacturing process of the probe card of the present invention and the first and second stair-shaped structures are accurately aligned with each other, it can be ensured that after the probe card completely assembled, the probe points will be positioned with a correct orientation (e.g. the pinpoint of the probe is perpendicular to the DUT). In the case that the probe card has a plurality of probes, the probe card is ensured that the imaginary plane defined by the pinpoints of the probes has a great flatness relative to the DUT. In other words, the probe card of the present invention needs not to be provided with any mechanism for adjusting the orientation of the probe. Besides, the probe card of the present invention is simple and compact in structure and accurate in alignment, thereby saving assembling time, and preventing the time-consuming process of correcting the orientation of the probe. Besides, when the probe is damaged, the probe module can be quickly replaced after the pressing force from the pressing member is released.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein.

DETAILED DESCRIPTION OF THE INVENTION

Figure 1:
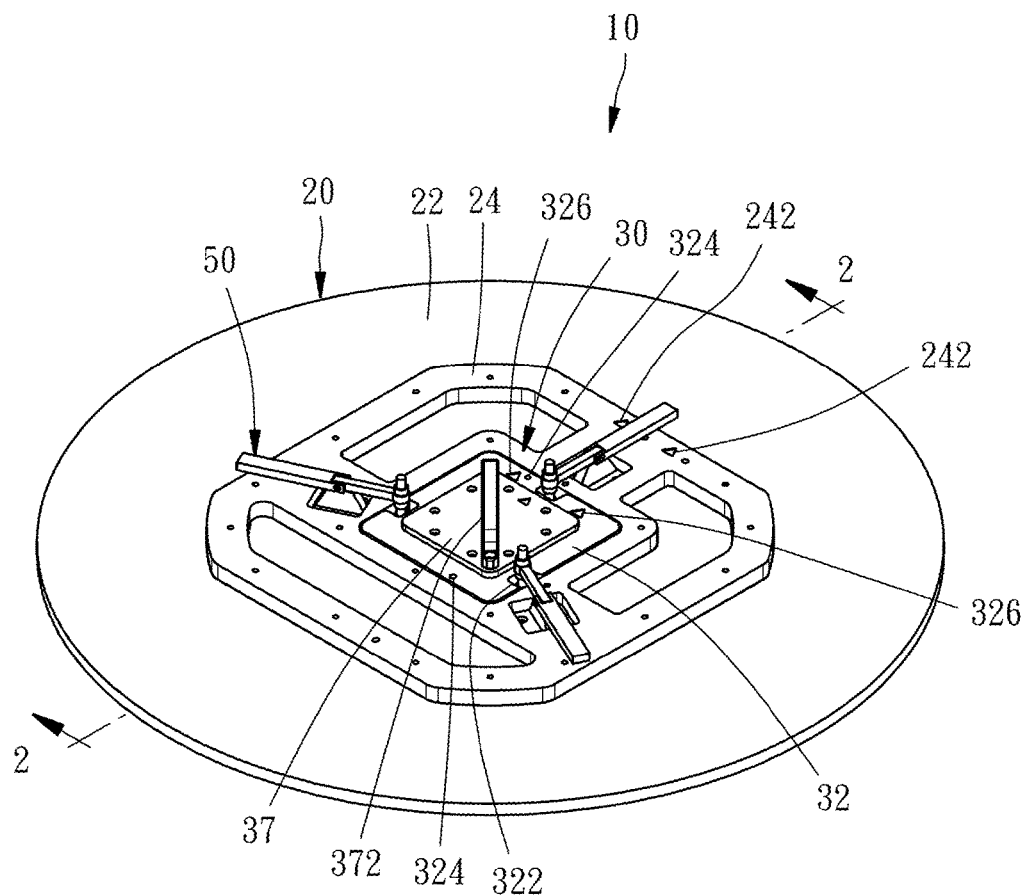
FIG. 1 is an assembled perspective view of a probe card having a replaceable probe module according to a first preferred embodiment of the present invention.

First of all, it is to be mentioned that same reference numerals used in the following preferred embodiments and the appendix drawings designate same or similar elements or structural features thereof. It should be noticed that for the convenience of illustration, the elements and structures shown in the figures may not be drawn to the actual scale. Besides, the features mentioned in different embodiments may be applied reciprocally if applicable.

Referring to FIGS. 1-4, a probe card 10 according to a first preferred embodiment of the present invention includes a substrate module 20, a probe module 30, a film-shaped anisotropic conductive adhesive 40 that can be optionally used in this embodiment, and three pressing members 50.

The substrate module 20 includes a circuit board 22 which is also called first circuit board, and a strengthening plate 24 which is also called substrate module strengthening plate. The strengthening plate 24 is made of metal or reinforced material and fastened to the circuit board 22 by a plurality of screws or fastening pins for structurally strengthening the circuit board 22. The aforesaid screws or fastening pins correspond in position to the circular holes of the circuit board 22 and the strengthening plate 24 shown in the figures. For simplifying the figures, the screws or fastening pins are not shown in the figures. The circuit board 22 may be an ordinary resin substrate, multi-layered ceramic substrate, multi-layered organic substrate, and so on. The circuit board 22 is provided on the outer portion of the top surface thereof with a plurality of contact pads (not shown) for being electrically connected with a tester (not shown). The contact pads at the outer portion are electrically connected with first contact pads (specified below) provided on the inner portion of the circuit board 22 through the inner embedded layout, surface layout and/or outer jump wires of the circuit board 22. For simplifying the figures, the contact pads, layout, or other conductive or electronic elements of the circuit board 22 are not shown in FIGS. 1 and 3, and the aforesaid first contact pads can be seen in FIGS. 2 and 4.

Figure 2:
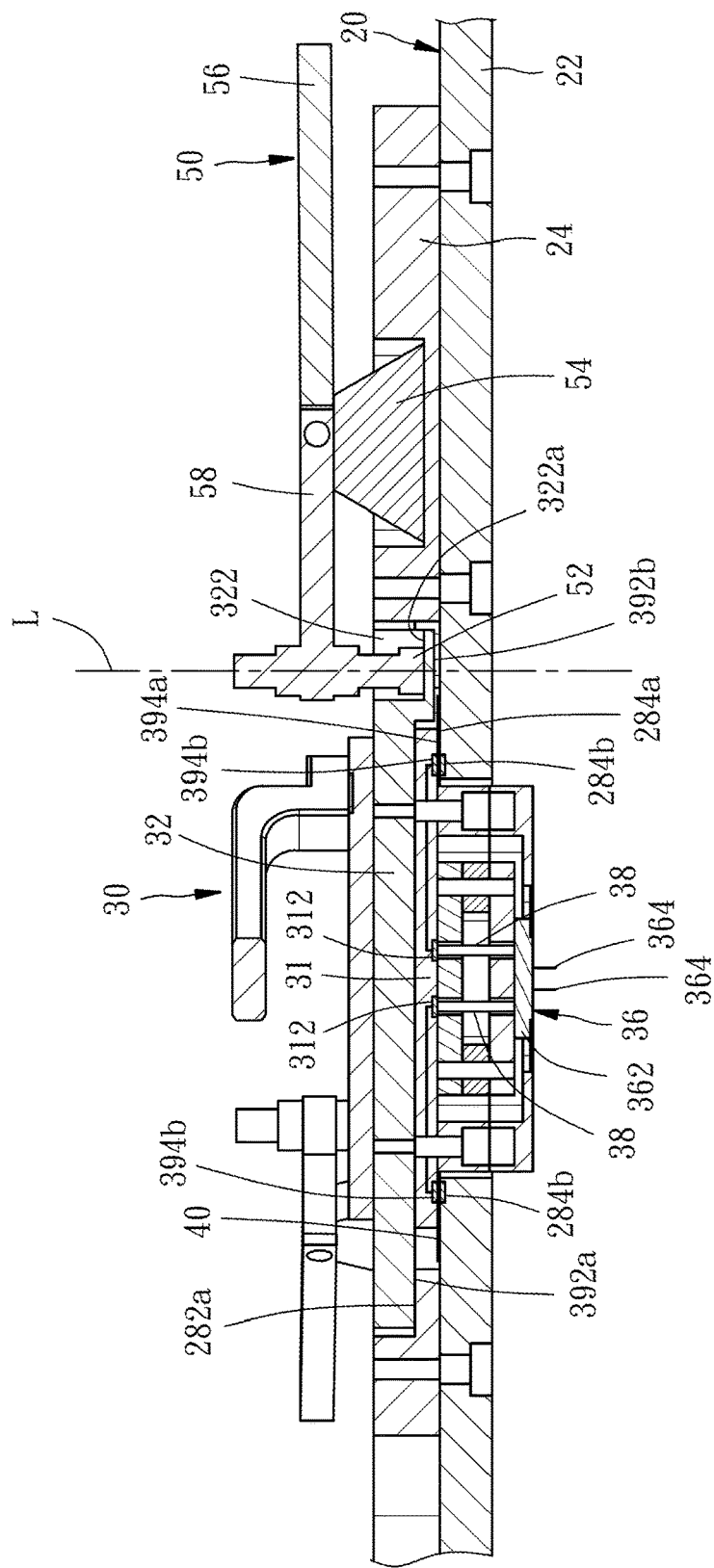
FIG. 2 is a sectional view taken along the line 2-2 in FIG. 1.
Figure 3:
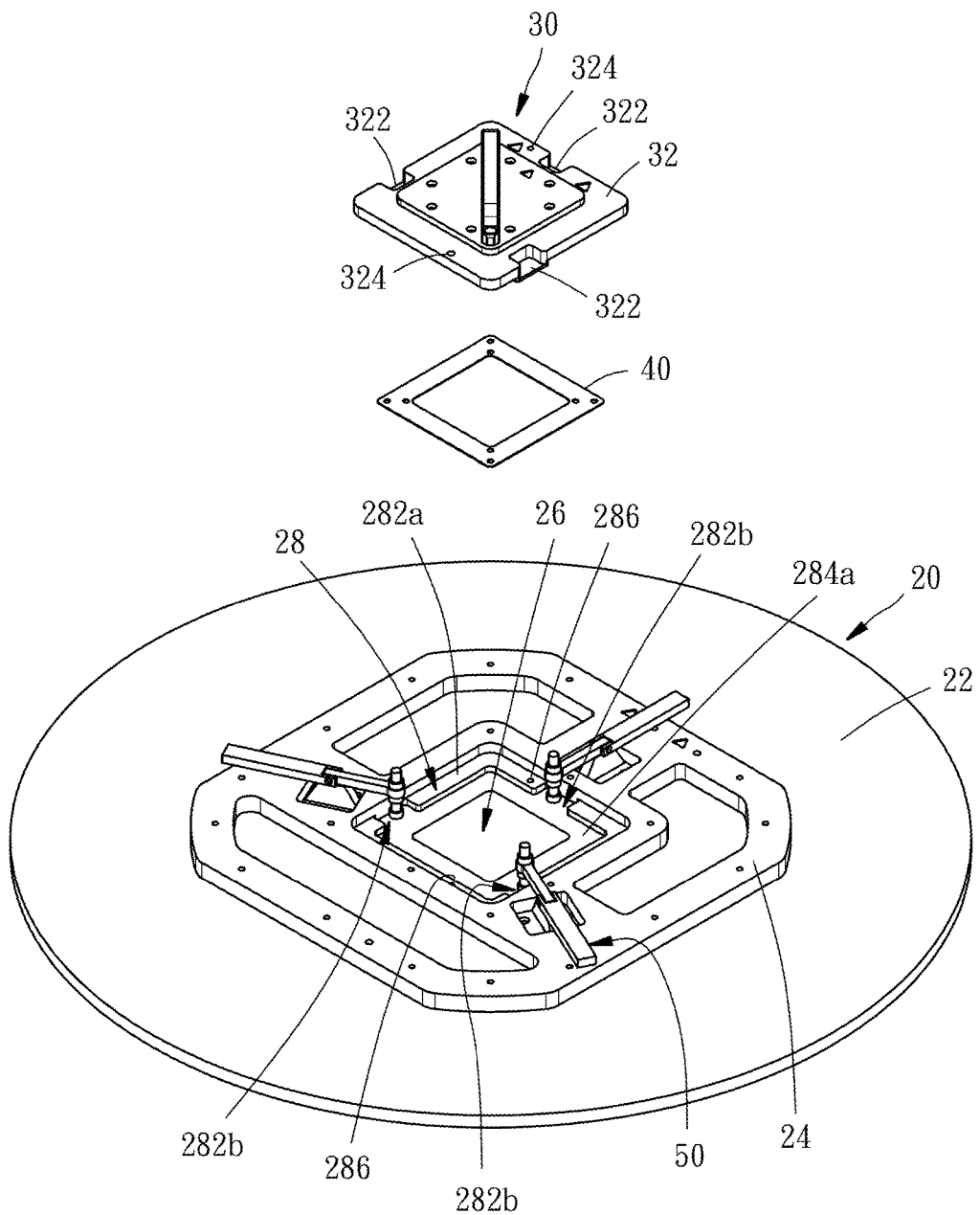
FIG. 3 is a partially exploded perspective view of the probe card having the replaceable probe module according to the first preferred embodiment of the present invention.
Figure 4:
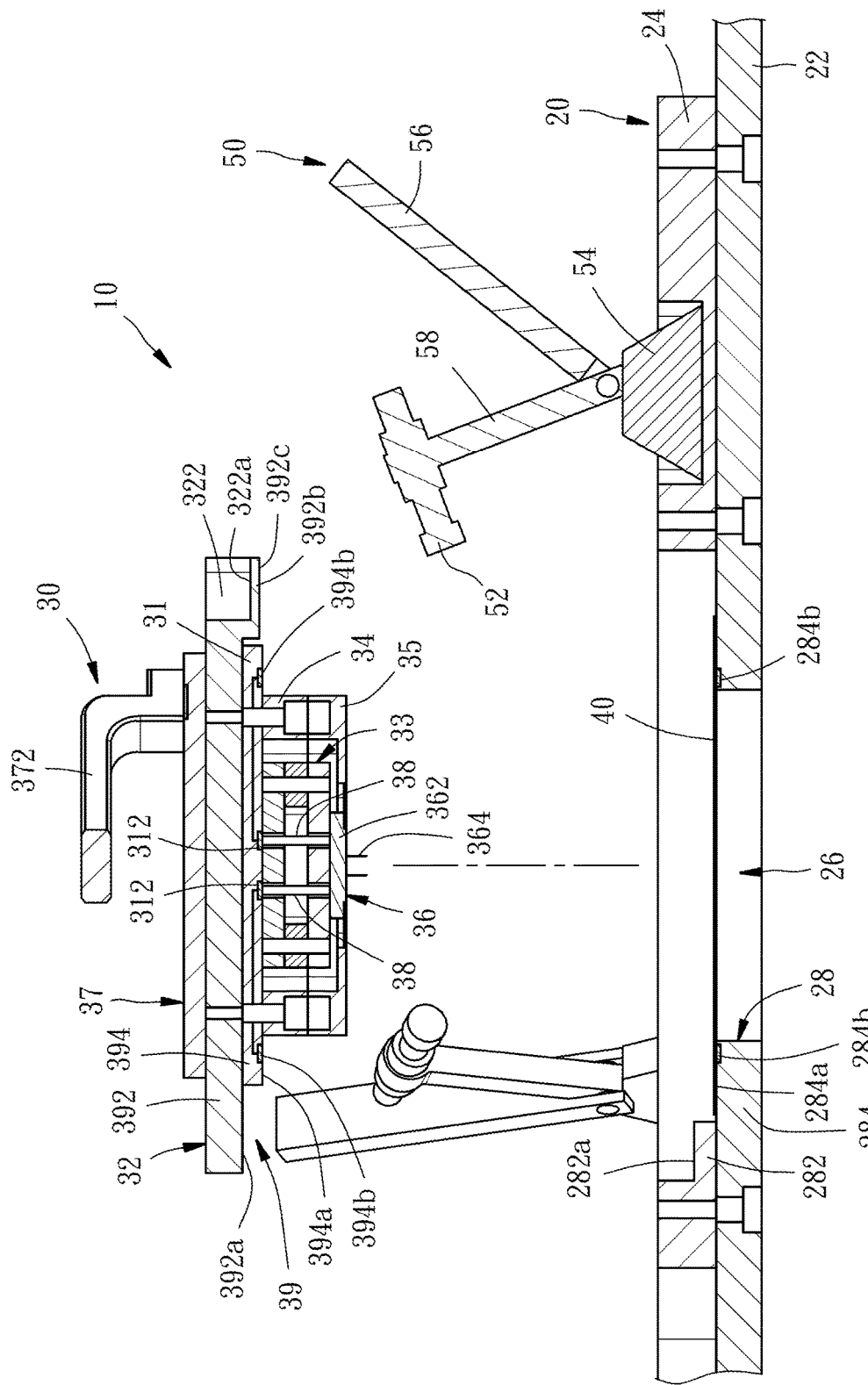
FIG. 4 is similar to FIG. 2, but showing the process of replacing the probe module.

As shown in FIGS. 3-4, the circuit board 22 has a central through hole penetrating through top and bottom surfaces of the circuit board 22, the strengthening plate 24 has a central though hole penetrating through top and bottom surfaces of the strengthening plate 24 and the central through holes of the circuit board 22 and the strengthening plate 24 are combined to form an installation hole 26 for the installation of the probe module 30 and a first stair-shaped structure 28 located on the inner wall of the installation hole 26. The stair-shaped structure mentioned in the present invention is shaped as a stairway having a plurality of stairs extended toward a certain direction from top to bottom or from bottom to top. For example, the stairs of the first stair-shaped structure 28 are extended toward the center of the installation hole 26 from top to bottom. The first stair-shaped structure 28 has a stair 282 (i.e. first stair, also called first substrate stair), which is located at the strengthening plate 24 and provided with a first connection surface 282a (also called first substrate connection surface). The first stair-shaped structure 28 has another stair 284 (i.e. second stair, also called second substrate stair), which is located at the circuit board 22 and provided with a first transmission surface 284a (also called first substrate transmission surface). The first transmission surface 284a is provided with a plurality of first contact pads 284b, as shown in FIGS. 2 and 4. The first stair 282 is a part of the strengthening plate 24, and the second stair 284 is a part of the circuit board 22. Preferably, the first stair 282 or the first connection surface 282a is located above and outside the periphery of the second stair 284 or the first transmission surface 284a, and the second stair 284 is shaped as a continuous annular or polygonal frame.

Figure 5:
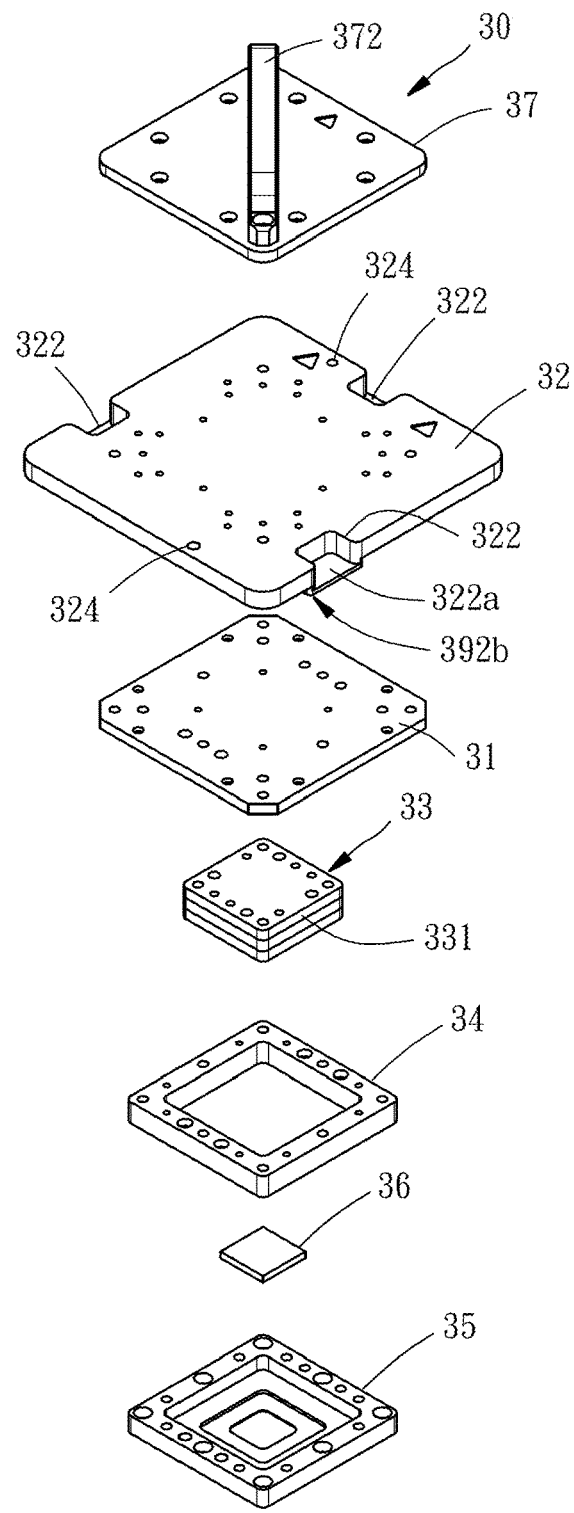
FIG. 5 is an exploded perspective view of the probe module of the probe card according to the first preferred embodiment of the present invention.

Referring to FIG. 5, the probe module 30 includes a circuit board 31 which is also called second circuit board, a strengthening plate 32 which is also called probe module strengthening plate and fastened to the circuit board 31 by a plurality of screws or fastening pins, an electric connector 33 fastened to the circuit board 31 by a plurality of screws or fastening pins, a fixed seat 34 fastened to the circuit board 31 and the strengthening plate 32 by a plurality of screws or fastening pins and surrounds around the periphery of the electric connector 33, a probe head installation seat 35 fastened to the fixed seat 34 by a plurality of screws or fastening pins, a probe head 36 disposed in the probe head installation seat 35, and a cover plate 37 fastened to the strengthening plate 32 by a plurality of screws or fastening pins and provided with a handle 372. The strengthening plate 32 is made of metal or reinforced material for structurally strengthening the circuit board 31. The circuit board 31 may be made of the same or different material from the aforesaid circuit board 22. The electric connector 33 includes a conductive pin installation seat 331 and a plurality of conductive pins 38, such as pogo pins, inserted through the conductive pin installation seat 331, as shown in FIGS. 2 and 4. For simplifying the figure, the conductive pins 38 and the through holes where the conductive pins 38 are inserted are not shown in FIG. 5. The aforesaid screws or fastening pins correspond in position to the circular holes shown in FIG. 5. For simplifying the figures, the screws or fastening pins are not shown in the figures, and the contact pads, layout, or other conductive elements of the circuit board 31 are not shown in FIG. 5 too. However, second and third contact pads, which are to be depicted below, are shown in FIGS. 2 and 4.

As shown in FIG. 4, the probe module 30 is provided at the periphery thereof with a second stair-shaped structure 39 which has a plurality of stairs extended away from the center of the probe module 30 from bottom to top. The second stair-shaped structure 39 has a stair 392 (i.e. first stair, also called first probe stair), which is located at the strengthening plate 32 and provided with a second connection surface 392a (also called first probe connection surface). The second stair-shaped structure 39 has another stair 394 (i.e. second stair, also called second probe stair), which is located at the circuit board 31 and provided with a second transmission surface 394a (also called first probe transmission surface). The second transmission surface 394a is provided with a plurality of second contact pads 394b which are electrically connected with third contact pads 312 located at the central part of the circuit board 31 through the inner embedded layout of the circuit board 31. The first stair 392 is a part of the strengthening plate 32, and the second stair 394 is a part of the circuit board 31. Preferably, the first stair 392 is located above and outside the periphery of the fixed seat 34 and the probe head installation seat 35; the first stair 392 or the second connection surface 392a is located above and outside the periphery of the second stair 394 or the second transmission surface 394a, and the strengthening plate 32 (the central part thereof) is located on the circuit board 31.

Figure 7:
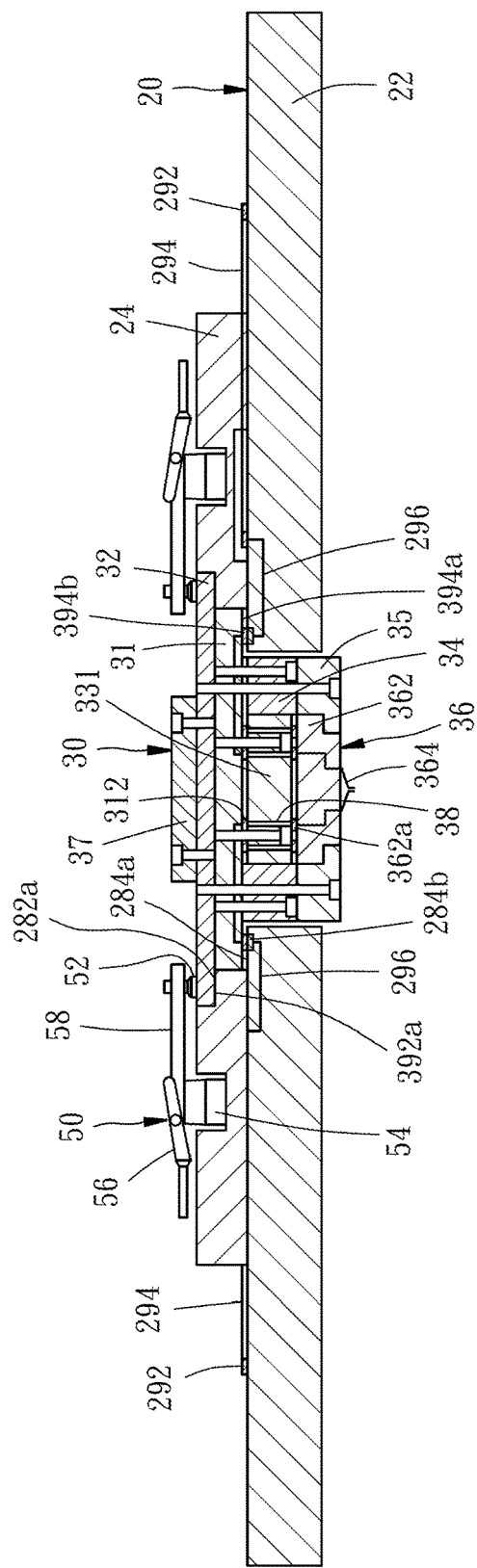
FIG. 7 is a schematic sectional view of a probe card having a replaceable probe module according to a second preferred embodiment of the present invention.

The electric connector 33 serves as the bridge of electrical connection between the circuit board 31 and the probe head 36. According to the actual size, the probe module 30 may be configured in a way that the circuit board 31 is electrically connected with the probe head 36 directly. In such case, the probe module 30 may have no such electric connector 33. In this embodiment, the conductive pin installation seat 331 of the electric connector 33 is composed of three plates. However, the conductive pin installation seat 331 of the electric connector 33 may be integrally made as one-piece member, as shown in FIG. 7.

Figure 8:
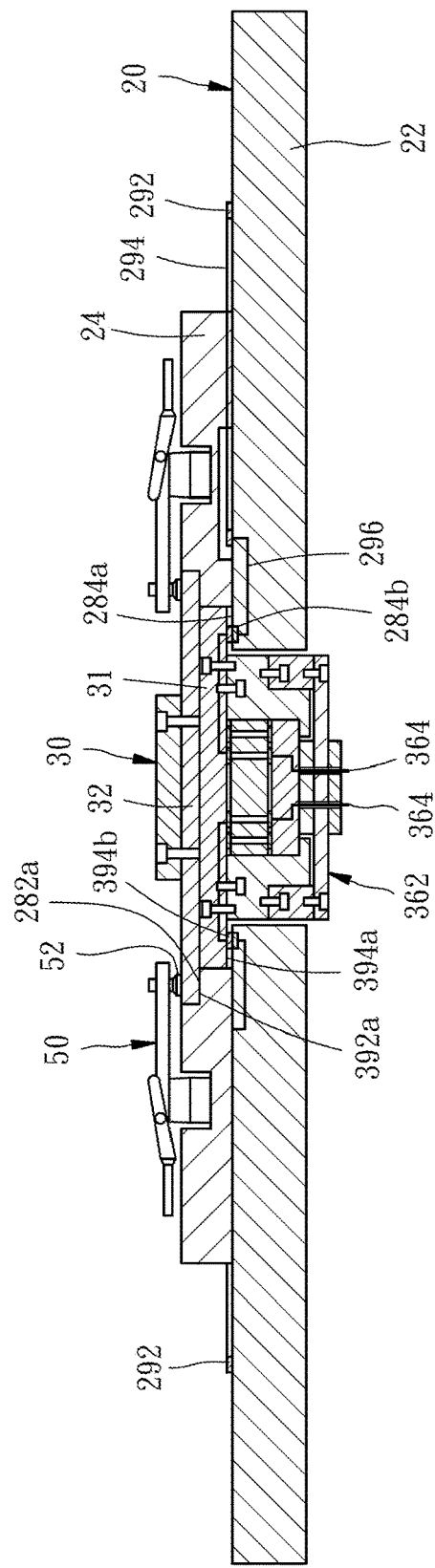
FIG. 8 is a schematic sectional view of a probe card having a replaceable probe module according to a third preferred embodiment of the present invention.

The probe head 36 includes a probe seat 362, and a plurality of probes 364 disposed on the probe seat 362. In this embodiment, the probe seat 362 is a circuit board; the probes 364 are connected to the bottom surface of the probe seat 362 or formed on the bottom surface of the probe seat 362 by microelectromechanical system (hereinafter referred to as "MEMS") manufacturing process, and electrically connected with contact pads provided on the top surface of the probe seat 362 through the inner embedded layout of the probe seat 362. For simplifying the figures, the contact pads and inner embedded layout mentioned here are not shown in the figures of this embodiment, but similar features to them are shown in FIGS. 7-8.

The conductive pins 38 of the electric connector 33 are respectively abutted against the third contact pads 312 of the circuit board 31 by an end thereof, and abutted against the contact pads on the top surface of the probe seat 362 by the other end thereof. Because the third contact pads 312 are electrically connected with the second contact pads 394b respectively through the inner embedded layout of the circuit board 31, the second contact pads 394b are electrically connected with the probes 364 respectively through the inner embedded layout of the circuit board 31, the third contact pads 312, the conductive pins 38 and the inner embedded layout of the probe seat 362.

For simplifying the figures, the contact pads 284b, 394b and 312 shown in the figures of this embodiment are embedded in the circuit board 22 or the circuit board 31. In fact, the contact pads 284b, 394b and 312 are usually a little protruded out from the surfaces of the circuit board 22 or the circuit board 31. The probe card 10 usually includes a plurality of probes 364. The first, second and third contact pads 284b, 394b, 312 and the conductive pins 38 are at least the same in amount with the probes 364. However, it will be appreciated that the amounts of the probes, the first, second and third contact pads and the conductive pins of the probe card of the present invention are not limited.

The assembling method of the probe card 10 of the present invention includes the steps of providing the modularized substrate module 20 and probe module 30, which means the substrate module 20 and the probe module 30 are respectively assembled in the manner mentioned above, and then positioning and disposing the probe module 30 in the installation hole 26 of the substrate module 20 in a way that the first connection surface 282a is connected with the second connection surface 392a and the first transmission surface 284a faces the second transmission surface 394a, as shown in FIG. 2. In this embodiment, an electric connector such as the anisotropic conductive adhesive 40 is disposed on the first transmission surface 284a before the probe module 30 is disposed in the installation hole 26, so that the first transmission surface 284a faces the second transmission surface 394a with the anisotropic conductive adhesive 40 disposed therebetween. The last step is pressing a pressing portion 52 of each pressing member 50 on the probe module 30. At this time, each pressing portion 52 applies a pressing force on the probe module 30 to press the second connection surface 392a against the first connection surface 282a (i.e. align the first stair 392 made of rigid material on the first stair 282 made of rigid material to make the stairs 392 and 282 contact each other tightly) and make the first contact pads 284b be electrically aligned and connected with the second contact pads 394b respectively. As a result, the tester can be electrically connected with the probes 364 through the circuit board 22, the first transmission surface 284a of the first stair-shaped structure 28, the second transmission surface 394a of the second stair-shaped structure 39 and/or the circuit board 31, for providing test signal to test a DUT such as a wafer or a die (not shown). As shown in FIGS. 7-8, the probe card 10 may have no such electric connector (i.e. the anisotropic conductive adhesive 40) disposed between the substrate module 20 and the probe module 30. In such case, the first contact pads 284b are electrically connected with the second contact pads 394b directly. However, the anisotropic conductive adhesive 40 can improve the positivity of the electrical connection between the first and second contact pads 284b and 394b, and provide buffering effect to prevent the first and second contact pads 284b, 394b from damage. In fact, before the pressing members 50 are pressed on the probe module 30, the first and second contact pads 284b and 394b are directly connected with each other or indirectly connected with each other through the anisotropic conductive adhesive 40, achieving electrical connection therebetween; however, the electrical connection between the first and second contact pads 284b and 394b may be not reliable because of defective contact. The pressing force from the pressing members 50 can ensure that the first contact pads 284b are electrically and positively connected with the second contact pads 394b respectively. The electric connector disposed between the substrate module 20 and the probe module 30 is not limited to the anisotropic conductive adhesive 40 as disclosed in the present embodiment. For the electric connector, pogo pins, spring needles or other kinds of flexible conductor may be used.

When one or more probes are damaged, the user can quickly replace the probe module 30 with a new one after releasing the pressing force from the pressing members 50, such that the user can use the probe card 10 again in a short time. That means, the substrate module 20 can be continuously and long-lastingly used, and the probe card 10 needs not to be entirely sent off for repair, so that the testing process will not be interrupted for a long time, or the probe card 10 needs not to be entirely discarded to cause waste.

The probe module replacing method of the probe card 10 of the present invention includes the steps of releasing the pressing force applied on the probe module 30 by the pressing members 50, then taking the probe module 30 out of the installation hole 26 of the substrate module 20, then disposing another substitute probe module in the installation hole 26 in the aforesaid manner of disposing the former probe module 30, and then pressing the pressing portions 52 of the pressing members 50 on the substitute probe module. In this way, the user can quickly replace the probe module 30 of the probe card 10 of the present invention and use the probe card 10 with the substitute probe module right after the replacement.

In this embodiment, each pressing member 50 is a toggle clamp including a fixed seat 54 fixed on the strengthening plate 24, a handle bar 56 swingable by the operation of the user, and a swinging arm 58 swingable relative to the fixed seat 54 when the toggle clamp 50 is operated by the user; the pressing portion 52 is located at the swinging arm 58. When the handle bar 56 is applied with a downward force in a way that the fixed seat 54 is taken as a fulcrum, the pressing portion 52 can be pressed on a bottom surface 322a of an accommodating recess 322 (specified below) of the strengthening plate 32. When the handle bar 56 is applied with an upward force, the pressing force applied on the strengthening plate 32 by the pressing portion 52 can be released. The toggle clamp is adopted in this embodiment to serve as the pressing member 50, which can be operated by the user quickly, so that the user can assemble the probe card 10 or replace the probe module 30 quickly. However, the pressing member 50 is not limited to the toggle clamp, but may be any other device capable of providing the pressing force which can be applied to press the probe module 30 on the substrate module 20 and released by the user. For example, the pressing member may be a screw bolt inserted in the substrate module 20 and provided with a head portion serving as the pressing portion. By rotating the screw bolt, the head portion (pressing portion) can be pressed on the probe module 30 to fix the probe module 30 to the substrate module 20, or the head portion (pressing portion) can be detached from the probe module 30 to release the pressing force applied on the probe module 30 so as to enable the probe module 30 to be removed from the substrate module 20. For another example, the pressing member may be a metal spring plate rotatably mounted on the substrate module 20 and provided with an end detachably pressed on the probe module 30, so that the probe module 30 can be fixed to or removed from the substrate module 20 quickly. In other words, the pressing member 50 in the present invention is not limited to the toggle clamp provided in this embodiment.

Besides, as long as the first and second connection surfaces 282a and 392a are processed by precise vertical-and-horizontal plane machining in the manufacturing process of the probe card 10, and the first and second stair-shaped structures 28 and 39 are accurately aligned with each other in assembling of the probe card 10, it is ensured that the probe 364 points are arranged with a correct orientation (e.g. the pinpoint of the probe is perpendicular to the DUT) after the probe card 10 is completely assembled. In the case that the probe card has a plurality of probes 364, the probe card is ensured that the imaginary plane defined by the pinpoints of the probes 364 has a great flatness and an accurate alignment relative to the DUT. Especially in the case that the strengthening plate 24 having the first connection surface 282a and the strengthening plate 32 having the second connection surface 392a are both made of metal or reinforced material, the aforesaid precise plane machining can be easily achieved. In other words, the probe card 10 of the present invention needs not to be provided with any mechanism for adjusting the orientation of the probe. Besides, the probe card of the present invention is simple and compact in structure and easily assembled and disassembled, thereby saving assembling time, and preventing the time-consuming process of correcting the orientation of the probe.

The probe card 10 of the present invention is configured having modularized and replaceable probe module 30, which can be replaced by the user with a whole new probe module 30 when some probes of the probe module 30 that is in current use are damaged, so the probe head 36 can be fixed in a nondismountable manner by gluing or other firmer fixing way for preventing the probe head 36 from displacement so as to maintain the position and orientation of the probes 364. The probe module 30 may be even assembled in the aforesaid manner of using screws and then entirely fixed by gluing, thereby improving assembling accuracy. Besides, the probe card 10 in this embodiment is configured having the handle 372 to be held by the user for easily and quickly uninstall and install the probe module 30, so that the user can replace the probe module 30 more quickly and conveniently. However, the probe module 30 may have no such handle 372 or cover plate 37.

In practice, the substrate module 20 may include no such strengthening plate 24, which means the circuit board 22 may be configured with the first stair-shaped structure 28 by means of only one board or a plurality of boards piled on one another. However, in the aforesaid design that the first stair-shaped structure 28 is formed by the combination of the circuit board 22 and the strengthening plate 24, the strengthening plate 24 can be made of relatively stronger material, such as a metal plate, to provide higher machinability, alignment accuracy and mechanical strength to prevent the substrate module 20 from being deformed or damaged due to mechanical loading, thermal gradient, stress, and so on, and the fixed seat 54 of the toggle clamp 50 can be fixed on the strengthening plate 24. In this way, the electrical and mechanical properties of the circuit board 22 are less possibly damaged; the first connection surface 282a is less possibly deformed, such that it can be positively connected with the second connection surface 392a; the material of the strengthening plate 24 brings the first connection surface 282a a relatively stronger structural property to bear the pressing stress and the weight of the probe module 30 and to make the toggle clamp 50 stable so as to ensure that the pressing force can be provided in a correct direction, thereby improving the durability of the substrate module 20 that may have to sustain many times of the replacements of the probe modules 30.

Likewise, the probe module 30 may include no such strengthening plate 32, which means the circuit board 31 may be configured with the second stair-shaped structure 39 by means of only one board or a plurality of boards piled on one another. However, in the aforesaid design that the second stair-shaped structure 39 is formed by the combination of the circuit board 31 and the strengthening plate 32, the strengthening plate 32 can be made of relatively stronger material, such as a metal plate, to enable the pressing portion 52 of the pressing member 50 to be pressed on the strengthening plate 32. In this way, the circuit board 31 or the probe module 30 is less possibly damaged; the second connection surface 392a is less possibly deformed, such that it can be positively connected with the first connection surface 282a; the material of the strengthening plate 32 brings the second connection surface 392a a relatively stronger structural property to bear the pressing stress. Besides, the primary structural feature of the probe module 30 is the second stair-shaped structure 39. The other parts of the probe module 30 are not limited to the parts provided in the aforesaid embodiment, as long as the probes 364 can be electrically connected with the second contact pads 394b of the circuit board 31. That means, depending on the practical requirements, the electric connector 33 is optionally installed and not limited to be composed of the conductive pin installation seat 331 and the conductive pins 38 as provided in this embodiment. For example, the electric connector 33 may be pogo pins, spring needles, anisotropic conductive adhesive, and so on.

Figure 6:
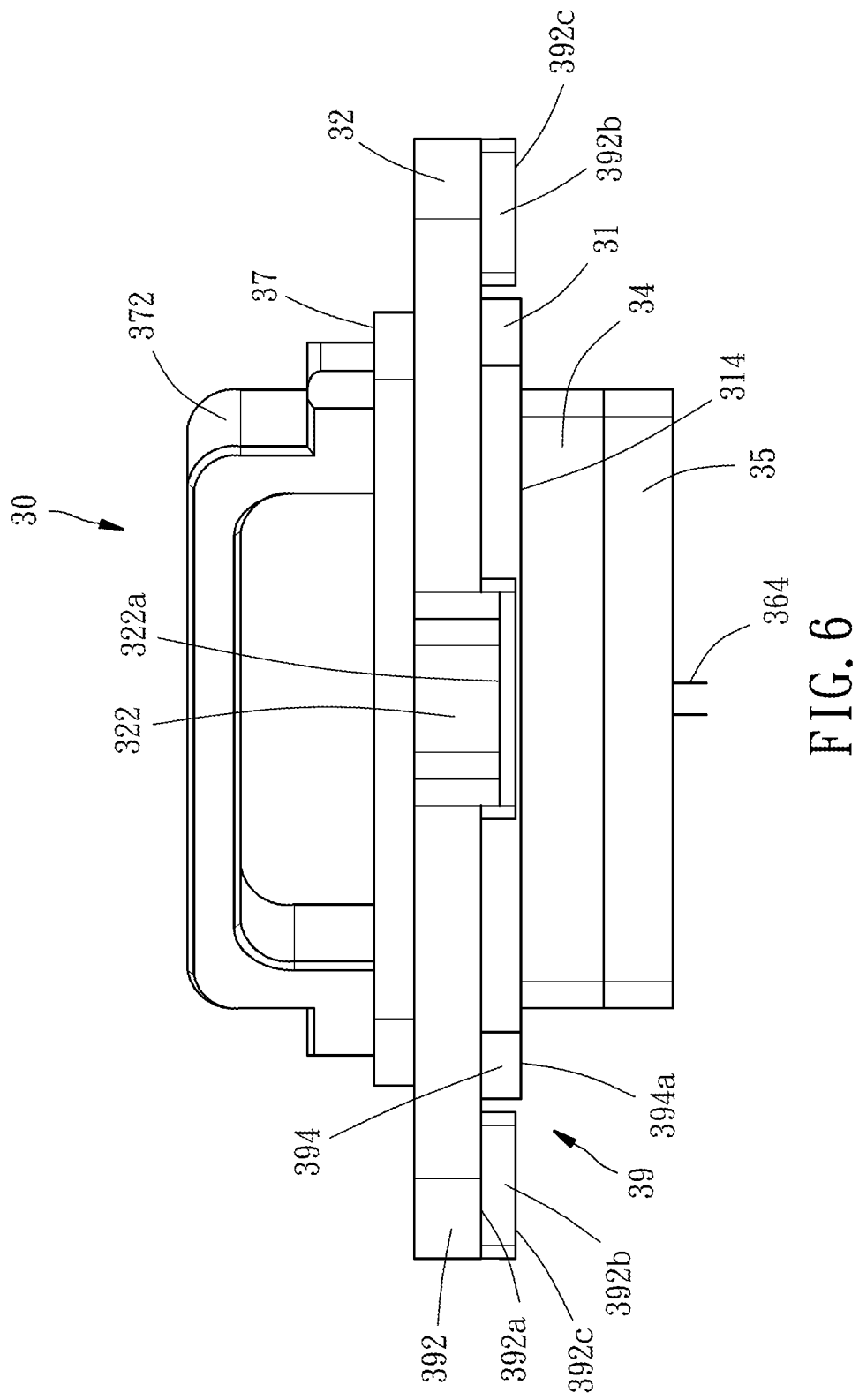
FIG. 6 is a rear view of the probe module of the probe card according to the first preferred embodiment of the present invention.

As shown in FIG. 3, the substrate module 20 has three positioning openings 282b located on the first stair 282. A polygonal annular structure is formed by the combination of the three positioning openings 282b and the first stair 282. The positioning openings 282b are located at between breaches of the first stair 282 (or in the first stair 282) and/or above the circuit board 22. In this embodiment, the positioning openings 282b penetrate through the strengthening plate 24 and directly located on the circuit board 22, but unlimited thereto. In other embodiments, the first stair 282 may be reserved with a thin layer at the position corresponding to each positioning opening 282b, and the thin layer is lower in elevation than the first connection surface 282a. In such case, the first stair 282 is not cut into three sections as shown in FIG. 3. Besides, the first stair 392 of the strengthening plate 32 of the probe module 30 has three protrusions 392b protruded from the second connection surface 392a of the first stair 392, as shown in FIG. 6. The protrusions 392b can be accurately aligned and engaged in the positioning openings 282b respectively. In this way, the assembler can quickly orient the probe module 30 correctly, thereby disposing the probe module 30 in the installation hole 26 quickly and ensuring that the pressing members 50 will be pressed on the predetermined positions. In addition, the strengthening plate 24 of the substrate module 20 is provided on the top surface thereof with two triangle positioning marks 242, and the strengthening plate 32 of the probe module 30 is also provided on the top surface thereof with two triangle positioning marks 326, as shown in FIG. 1. Such positioning marks 242 and 326 also enable the assembler to quickly orient the probe module 30 correctly by arranging the positioning marks 242 and 326 to point toward the same direction, so that the probe module 30 can be disposed in the installation hole 26 quickly.

As provided in this embodiment, the positioning openings 282b and the protrusions 392b may, but not limited to, be arranged correspondingly in position to where the pressing members 50 are pressed on the probe module 30. In other words, when the probe module 30 is located in the installation hole 26 and pressed by the pressing force from the pressing members 50, the pressing portions 52 of the pressing members 50 are located correspondingly to the protrusions 392b. That means, the associated pressing portion 52 and protrusion 392b, which correspond in position to each other, are located on the same imaginary vertical line L, as shown in FIG. 2. In such case, the strengthening plate 32 of the probe module 30 may, but not limited to, have three accommodating recesses 322 located correspondingly to the protrusions 392b respectively. That means, the associated recess 322 and protrusion 392b, which correspond in position to each other, are located on the same imaginary vertical line L, as shown in FIG. 2. Each recess 322 has a bottom surface 322a located correspondingly to a position between the second connection surface 392a and the second transmission surface 394a. That means, in FIG. 2, the bottom surface 322a is higher in elevation than the second transmission surface 394a but lower in elevation than the second connection surface 392a and the top surface of the strengthening plate 32 or the first stair 392. When the probe module 30 is located in the installation hole 26 and pressed by the pressing force from the pressing members 50, the pressing portions 52 of the pressing members 50 are located in the recesses 322 respectively and pressed on the bottom surfaces 322a of the recesses 322 respectively. In this way, although the pressing force from the pressing members 50 is not directly applied at the position corresponding to where the first and second connection surfaces 282a and 392a are connected, the aforesaid design can improve the effect that the first and second connection surfaces 282a and 392a are pressed by the pressing force from the pressing members 50, so that the first and second connection surfaces 282a and 392a are positively abutted against each other, ensuring that the probes 364 point toward the correct orientation. Besides, as shown in FIGS. 4 and 6, the bottom surfaces 392c of the protrusions 392b may, but not limited to, be a little higher in elevation than the second transmission surface 394a or the bottom surface 314 of the circuit board 31. In such case, in the process that the pressing portions 52 are pressed on the bottom surfaces 322a of the recesses 322, the second connection surface 392a of the first stair 392 of the strengthening plate 32 is in contact with and pressed against the first connection surface 282a of the first stair 282 of the strengthening plate 24, and then the bottom surfaces 392c of the protrusions 392b of the first stair 392 of the strengthening plate 32 are directly or indirectly contacted with the circuit board 22 at positions corresponding to (or below) the protrusions with relatively smaller stress. As a result, the second connection surface 392a of the strengthening plate 32 and the first connection surface 282a of the strengthening plate 24, which have relatively larger contact area, bear the most of the pressing stress and the weight of the probe module 30, thereby protecting the circuit board 22 or other elements. Alternately, if the bottom surfaces 392c of the protrusions 392b are higher in elevation than the bottom surface 314 of the circuit board 31 for a predetermined height, the bottom surfaces 392c of the protrusions 392b of the strengthening plate 32 may not be contacted with the circuit board 22 when the pressing portions 52 are pressed on the bottom surfaces 322a of the recesses 322.

In this embodiment, the probe card has a plurality of positioning openings 282b, protrusions 392b and accommodating recesses 322, which are the same in amount with the pressing members 50. Besides, the positions of the positioning openings 282b, protrusions 392b and accommodating recesses 322 are arranged asymmetrically. In the present invention, when it is mentioned that some identical elements are arranged asymmetrically, it is aimed at all the elements, e.g. all the positioning openings 282b, all the protrusions 392b or all the accommodating recesses 322. Taking the positioning openings 282b for example, two of the three positioning openings 282b in this embodiment are symmetric with each other, but the other one is not symmetric with any positioning opening 282b. Therefore, according to the definition of the present invention, the positioning openings 282b are arranged asymmetrically. When the probe module 30 is to be installed into the installation hole 26 with an angular orientation difference of 90, 180 or 270 degrees from the predetermined orientation of the probe module 30, the installation will fail because the protrusions 392b are not in alignment with the positioning openings 282b. Therefore, the aforesaid design that the positioning openings 282b and the protrusions 392b are arranged asymmetrically is beneficial for aligning the probe module 30 with the substrate module 20, enabling the assembler to orient the probe module 30 correctly and install the probe module 30 in the installation hole 26 quickly. Besides, the pressing members 50 of the same amount with the protrusions 392b are pressed on the positions corresponding to the protrusions 392b, so the positions where the probe module 30 is pressed can be arranged to provide more balanced pressing force on the probe module 30. However, the positioning openings 282b, the protrusions 392b, the accommodating recesses 322 and the pressing members 50 are not limited to the numbers provided in the present embodiment. Besides, the strengthening plate 32 may have a plurality of positioning holes 324, the first stair 282 of the strengthening plate 24 may have a plurality of positioning holes 286, and the positioning holes 324 can be accurately aligned with the positioning holes 286 by means of positioning pins (not shown) located in the positioning holes 324 or the positioning holes 286. In other embodiments, the positioning pins (not shown) may be inserted into the positioning holes from the outside.

As disclosed in the second preferred embodiment of the present invention shown in FIG. 7 and the third preferred embodiment of the present invention shown in FIG. 8, the probe card of the present invention may have no such positioning opening 282b, protrusion 392b and accommodating recess 322 as mentioned in the aforesaid first embodiment, but still have the other features of the first and second stair-shaped structures 28 and 39 for accurate alignment. In such case, the pressing portion 52 of the pressing member 50 is pressed on the position corresponding to the first and second connection surfaces 282a and 392a. That means, the pressing force from the pressing member 50 is directly applied on the top surface of the strengthening plate 32 of the probe module 30 and corresponds in position to where the first and second connection surfaces 282a and 392a are connected, so that the first and second connection surfaces 282a and 392a are positively abutted against each other. In other words, when the pressing portion 52 is pressed on the probe module 30 in a way that the fixed seat 54 is taken as the fulcrum, the first stair 392 of the strengthening plate 32 and the first stair 282 of the strengthening plate 24 are located under the pressing portion 52 to directly bear the pressing stress, thereby protecting the circuit board 22 or other elements and ensuring that the probes 364 point toward the correct orientation. The first stair 392 and the first stair 282 may be shaped as a continuous annular or polygonal frame. In other embodiments, the probe card of the present invention may have no such positioning opening 282b and protrusion 392b, but have the accommodating recess 322 for accommodating the pressing portion 52. That means, when being pressed on the probe module 30, the pressing portion 52 is pressed on a bottom surface of the accommodating recess 322 located on the first stair 392 of the strengthening plate 32. The bottom surface of the accommodating recess 322 is lower in elevation than the top surface of the first stair 392 of the strengthening plate 32. The bottom surface of the first stair 392 is substantially a plane shaped as a continuous annular or polygonal frame. Besides, in other embodiments, the probe card of the present invention may have the protrusion 392b and the positioning opening 282b to enable the first stair 392 and the first stair 282 to be aligned and engaged with each other, but the pressing portion 52 may be pressed on other positions than the position corresponding to the protrusion 392b of the first stair 392.

It should be mentioned that in the aforesaid first preferred embodiment, the circuit board 22 is provided with a plurality of connecting points 292 surrounding the strengthening plate 24, as shown in FIGS. 7-8. The connecting points 292, which may be conductive pads or terminals, are adapted for being contacted by conductive pins (not shown) extending from a tester (not shown). Alternately, a plurality of connecting points 292 may be integrally combined in an electric connector and electrically connected with the tester through a transmission cable plugged into the electric connector. The connecting points 292 are electrically connected with the first contact pads 284b respectively through the jump wires 294 arranged on the circuit board 22 and/or the wiring layout 296 arranged on the top surface, bottom surface or inner layers of the circuit board 22, thereby enabling electrical connection between the probes 364 and the tester.

The type of the probe used in the probe card of the present invention is not limited. For example, vertical probes are adopted in the first preferred embodiment as shown in FIG. 2 and the third preferred embodiment as shown in FIG. 8, and cantilever probes are adopted in the second preferred embodiment as shown in FIG. 7. For another example, the probe may be shaped with elasticity by mechanical processing and connected to the bottom surface of the circuit board. Alternately, the probe may be a MEMS probe formed on the bottom surface of the circuit board by MEMS manufacturing process. Besides, the probe may be a coaxial wire as shown in FIG. 25 of US Patent Pub. No. 2007/0007977 mentioned in the description of the related art of the present application. Furthermore, the probe may be a pogo pin, a bump, a stud, a pressing spring, a needle, a buckling probe, and so on.

As shown in FIG. 7, the probe seat 362 may be a circuit board; the probes 364 are electrically connected with the contact pad 362a provided on the top surface of the probe seat 362 through the inner embedded layout of the probe seat 362, further electrically connected with the third contact pads 312 provided on the bottom surface of the circuit board 31 through the conductive pins 38, and further electrically connected with the second contact pads 394b through the inner embedded layout of the circuit board 31. However, the probe seat 362 may be not a circuit board. For example, the probe seat 362 shown in FIG. 8 is composed of three insulating dies (not circuit board), through which the probe 364 are inserted.

The invention being thus described, it will be obvious that the same/may be varied in many ways. Such variations are not to be regarded as a departure from the spirit and scope of the invention, and all such modifications as would be obvious to one skilled in the art are intended to be included within the scope of the following claims.

What is claimed is:
1. A probe card comprising:
a substrate module having an installation hole and a first stair-shaped structure which is located on an inner wall of the installation hole and provided with a first substrate stair having a first connection surface, and a second substrate stair having a first transmission surface provided with a first contact pad;
a probe module having a probe and a second stair-shaped structure which is provided with a first probe stair having a second connection surface, and a second probe stair having a second transmission surface provided with a second contact pad electrically connected with the probe, the probe module being disposed in the installation hole of the substrate module in a way that the first connection surface is connected with the second connection surface and the first transmission surface faces the second transmission surface; and a pressing member having a pressing portion which is detachably pressed on the probe module in a way that the second connection surface is abutted against the first connection surface and the first contact pad is electrically connected with the second contact pad;

wherein the substrate module comprises a first circuit board provided with the first transmission surface, and a substrate module strengthening plate provided with the first connection surface; the probe module comprises a second circuit board provided with the second transmission surface, and a probe module strengthening plate provided with the second connection surface.

2. The probe card as claimed in claim 1, wherein the substrate module has a positioning opening located on the first substrate stair of the first stair-shaped structure; the probe module has a protrusion protruded from the first probe stair of the second stair-shaped structure and engaged in the positioning opening; when the probe module is located in the installation hole and pressed by the pressing member, the pressing portion of the pressing member is abutted on the probe module at a position corresponding to the protrusion.

3. The probe card as claimed in claim 2, wherein the substrate module has a plurality of said positioning openings arranged asymmetrically; the probe module has a plurality of said protrusions arranged asymmetrically and engaged in the positioning openings, respectively.

4. The probe card as claimed in claim 1, wherein the pressing member is a toggle clamp comprising a fixed seat fixed to the substrate module and a swinging arm swingable relative to the fixed seat when the toggle clamp is operated by a user; the pressing portion is provided at the swinging arm.

5. An assembling method of a probe card, the assembling method comprising the steps of:
providing a substrate module having an installation hole and a first stair-shaped structure which is located on an inner wall of the installation hole and provided with a first substrate stair having a first connection surface, and a second substrate stair having a first transmission surface provided with a first contact pad; the substrate module comprising a first circuit board provided with the first transmission surface, and a substrate module strengthening plate provided with the first connection surface;
providing a probe module having a probe and a second stair-shaped structure which is provided with a first probe stair having a second connection surface, and a second probe stair having a second transmission surface provided with a second contact pad electrically connected with the probe; the probe module comprising a second circuit board provided with the second transmission surface, and a probe module strengthening plate provided with the second connection surface;
disposing the probe module in the installation hole of the substrate module in a way that the first connection surface is connected with the second connection surface and the first transmission surface faces the second transmission surface; and
applying a pressing force on the probe module in a way that the second connection surface is abutted against the first connection surface and the first contact pad is electrically connected with the second contact pad.

6. A probe module replacing method of a probe card assembled by the assembling method as claimed in claim 5, the probe module replacing method comprising the steps of:
releasing the pressing force applied on the probe module;
taking the probe module out of the installation hole of the substrate module;
disposing another probe module in the installation hole of the substrate module in a way that the first connection surface of the substrate module is connected with a second connection surface of said another probe module and the first transmission surface of the substrate module faces a second transmission surface of said another probe module; and
applying a pressing force on said another probe module in a way that the second connection surface of said another probe module is abutted against the first connection surface and the first contact pad of the substrate module is electrically connected with a second contact pad of said another probe module.

7. A probe card comprising:
a substrate module having an installation hole, a first circuit board and a substrate module strengthening plate provided with a first substrate stair;
a probe module having a probe, a second circuit board and a probe module strengthening plate provided with a first probe stair; and
a pressing member having a pressing portion and a fixed seat fixed to the substrate module strengthening plate;
wherein when the pressing member exerts a force in a way that the fixed seat is taken as a fulcrum, the pressing portion is pressed on the first probe stair to press the first probe stair against the first substrate stair in a way that the probe module is detachably installed in the installation hole of the substrate module and the first circuit board is electrically connected with the probe through the second circuit board.

8. The probe card as claimed in claim 7, wherein the substrate module has a positioning opening located on the first substrate stair; the probe module has a protrusion protruded from the first probe stair and detachably engaged in the positioning opening; when the probe module is located in the installation hole and pressed by the pressing member, the pressing portion is pressed on a bottom surface of an accommodating recess corresponding in position to the protrusion.

9. The probe card as claimed in claim 8, wherein a bottom surface of the protrusion is higher in elevation than a bottom surface of the second circuit board.

10. The probe card as claimed in claim 8, wherein when the probe module is located in the installation hole and pressed by the pressing member, a first probe connection surface of the first probe stair is pressed against a first substrate connection surface of the first substrate stair and then a bottom surface of the protrusion is in contact with the first circuit board at a position corresponding to the protrusion.

11. The probe card as claimed in claim 7, wherein the first circuit board is provided with a second substrate stair; the second circuit board is provided with a second probe stair; when the probe module is located in the installation hole and pressed by the pressing member, a first substrate transmission surface of the second substrate stair is electrically connected with a first probe transmission surface of the second probe stair, such that the first circuit board is electrically connected with the probe through the second circuit board; the first probe stair is located above and around a periphery of the second probe stair.

12. The probe card as claimed in claim 7, wherein when the probe module is located in the installation hole and pressed by the pressing member, the pressing member is pressed on a bottom surface of an accommodating recess of the probe module strengthening plate and the bottom surface of the accommodating recess is lower in elevation than a top surface of the first probe stair.

* * * * *